United States Patent
Oda et al.

(10) Patent No.: US 9,299,576 B2
(45) Date of Patent: Mar. 29, 2016

(54) METHOD OF PLASMA ETCHING A TRENCH IN A SEMICONDUCTOR SUBSTRATE

(71) Applicant: DENSO CORPORATION, Kariya, Aichi-pref. (JP)

(72) Inventors: Youhei Oda, Okazaki (JP); Yoshitaka Noda, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/391,038

(22) PCT Filed: Apr. 19, 2013

(86) PCT No.: PCT/JP2013/002650
§ 371 (c)(1),
(2) Date: Oct. 7, 2014

(87) PCT Pub. No.: WO2013/168372
PCT Pub. Date: Nov. 14, 2013

(65) Prior Publication Data
US 2015/0118849 A1 Apr. 30, 2015

(30) Foreign Application Priority Data

May 7, 2012 (JP) .................................. 2012-106014
Mar. 26, 2013 (JP) .................................. 2013-64490

(51) Int. Cl.
*H01L 21/3065* (2006.01)
*H01L 21/308* (2006.01)

(52) U.S. Cl.
CPC ........ *H01L 21/30655* (2013.01); *H01L 21/308* (2013.01)

(58) Field of Classification Search
CPC .................. H01L 21/30655; H01L 21/308
See application file for complete search history.

(56) References Cited

U.S. PATENT DOCUMENTS

| | | | |
|---|---|---|---|
| 6,051,503 A | 4/2000 | Bhardwaj et al. | |
| 7,141,504 B1 | 11/2006 | Bhardwaj | |
| 7,205,226 B1 * | 4/2007 | Schaefer et al. | 438/637 |
| 2005/0287815 A1 * | 12/2005 | Lai et al. | 438/710 |
| 2011/0244687 A1 | 10/2011 | Oohara et al. | |

FOREIGN PATENT DOCUMENTS

| JP | H09-162177 A | 6/1997 |
|---|---|---|
| JP | 2002-521814 A | 7/2002 |

(Continued)

OTHER PUBLICATIONS

Office Action dated Dec. 26, 2014 in the corresponding TW application No. 102116065 (and English translation).
International Search Report mailed Jul. 30, 2013 in a corresponding PCT application No. PCT/JP2013/002650 (and English translation).

(Continued)

*Primary Examiner* — Mohammad Islam
*Assistant Examiner* — Charles R Peters
(74) *Attorney, Agent, or Firm* — Posz Law Group, PLC

(57) ABSTRACT

A trench is etched in a semiconductor wafer by turning a first introduced gas introduced into a reaction chamber into plasma. A protection film is formed on a wall surface of the trench by turning a second introduced gas introduced into the reaction chamber into plasma. The protection film formed on a bottom surface of the trench is removed by turning a third introduced gas introduced into the reaction chamber into plasma. The reaction chamber is evacuated after the protection film formed on the bottom surface of the trench is removed.

5 Claims, 8 Drawing Sheets

(56) References Cited

FOREIGN PATENT DOCUMENTS

| | | |
|---|---|---|
| JP | 2004-311673 A | 11/2004 |
| JP | 2008-205436 A | 9/2008 |
| JP | 2009-141307 A | 6/2009 |
| WO | 00/05749 A2 | 2/2000 |

OTHER PUBLICATIONS

Written Opinion mailed Jul. 30, 2013 in a corresponding PCT application No. PCT/JP2013/002650 (and English translation).

Office Action mailed Aug. 5, 2014 in a corresponding Japanese application No. 2013-64490 (and English translation).

* cited by examiner

METHOD OF PLASMA ETCHING A TRENCH IN A SEMICONDUCTOR SUBSTRATE

CROSS REFERENCE TO RELATED APPLICATION

This application is a U.S. national stage application of International Patent Application No. PCT/JP2013/002650 filed on Apr. 19, 2013 and is based on Japanese Patent Application No. 2012-106014 filed on May 7, 2012 and Japanese Patent Application No. 2013-64490 filed on Mar. 26, 2013, the contents of which are incorporated herein by reference.

TECHNICAL FIELD

The present disclosure relates to a manufacturing method of a semiconductor substrate with trenches formed by etching.

BACKGROUND

Conventionally, in order to obtain low on-resistance while obtaining a high breakdown voltage, a semiconductor device in the related art is formed using a semiconductor substrate having a super junction structure with a PN column structure formed by repetitively placing a P-type region and an N-type region in a planar direction.

As a manufacturing method of the semiconductor substrate as above, for example, PTL 1 proposes a method as follows. Firstly, in a semiconductor wafer having a plurality of chip forming regions, trenches are formed in the respective chip forming regions. Thereafter, trenches with a desired depth are formed by repetitively performing respective steps: a protection film forming step of forming a protection film on a wall surface of each trench by turning a $C_4F_8$ gas into plasma, an evacuation step of evacuating the $C_4F_8$ gas, and an etching step of digging down the trench by removing the protection film formed on a bottom surface of the trench by turning an $SF_6$ gas into plasma.

According to the proposed method above, a semiconductor substrate with a PN column structure is manufactured by embedding an epitaxial film in each trench. By dividing the semiconductor substrate into chips after a typical semiconductor fabrication process is performed, a semiconductor device having a PN column structure is manufactured.

Because the $C_4F_8$ gas is evacuated after the protection film is formed, mixing of the $C_4F_8$ gas with the $SF_6$ gas at the etching process can be suppressed. Accordingly, a reduction in strength of the protection film at the etching process can be suppressed and hence application of damage on the semiconductor wafer can be suppressed.

PATENT LITERATURE

PTL 1: JP-A-2008-205436

According to the manufacturing method above, however, a fluorine-based reaction gas is generated when the protection film is removed at the etching step and this reaction gas remains in the trench. Also, it is normal at the etching step to treat the semiconductor wafer by irradiating $SF_6$ plasma to the semiconductor wafer in a direction perpendicular to the planar direction. It should be noted, however, that a flow velocity of the $SF_6$ plasma is different between a center and an outer edge of the semiconductor wafer. More specifically, a flow velocity of the $SF_6$ plasma irradiated to the center of the semiconductor wafer is higher than the flow rate of the $SF_6$ plasma irradiated to the outer edge.

Hence, when the reaction gas remains in the trench, a proportion of radicals in the $SF_6$ plasma reaching the bottom surface of a trench formed in the center of the semiconductor wafer and a proportion of radicals in the $SF_6$ plasma reaching the bottom surface of a trench formed in the outer edge of the semiconductor wafer are different. Naturally, etching rates vary among the respective forming regions within a plane of the semiconductor wafer. In other words, the trenches formed in the respective chip forming regions within a plane of the semiconductor wafer have a variation in depth.

When a semiconductor device with a PN column structure is manufactured using a semiconductor wafer in which the trenches formed in the respective chip forming regions have varying depths, a breakdown voltage varies from chip to chip.

SUMMARY

In view of the foregoing, the present disclosure has an object to provide a manufacturing method of a semiconductor substrate capable of suppressing a variation in depth of trenches formed in respective chip forming regions within a plane of a semiconductor wafer.

Solution to Problem

According to one aspect of a manufacturing method of a semiconductor substrate disclosed here, a semiconductor wafer with a mask member patterned in a predetermined pattern and formed on a surface of the semiconductor wafer is introduced into a reaction chamber. A trench is etched in the semiconductor wafer according to the pattern of the mask member through treatment on the semiconductor wafer by introducing a first introduced gas into the reaction chamber and turning the first introduced gas into plasma. A protection film is formed on a wall surface of the trench through treatment on the semiconductor wafer by introducing a second introduced gas into the reaction chamber and turning the second introduced gas into plasma. The protection film formed on a bottom surface of the trench is removed through treatment on the semiconductor wafer by introducing a third introduced gas into the reaction chamber and turning the third introduced gas into plasma. The trench is dug down by repetitively etching the trench, forming the protection film, and removing the protection film formed on the bottom surface of the trench while the mask member is left on the semiconductor wafer. The reaction chamber is evacuated at least once after the protection film formed on the bottom surface of the trench is removed.

According to the manufacturing method above, because the reaction chamber is evacuated at least once after the protection film formed on the bottom surface of the trench is removed, a reaction gas remaining in the trench can be evacuated. Hence, a variation in etching rate among respective chip forming regions within a plane of the semiconductor wafer can be suppressed when the trenches are dug down. In other words, a variation in depth of the trenches formed in the respective chip forming regions within a plane of the semiconductor wafer can be suppressed.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
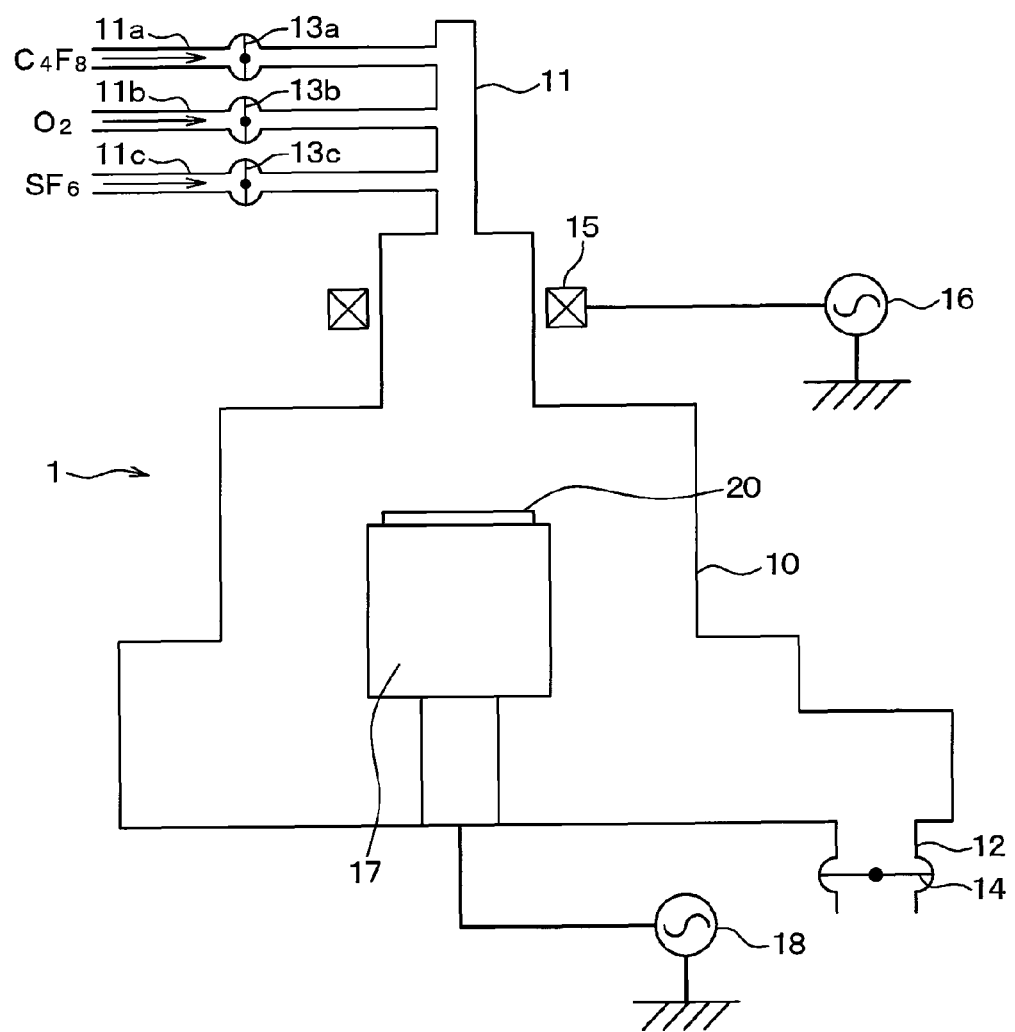
FIG. 1 is a schematic view of an etching device used in a manufacturing method of a semiconductor substrate according to a first embodiment of the present disclosure.

Hereinafter, embodiments of the present disclosure will be described according to the drawings. Descriptions will be given by labeling same or equivalent portions in respective embodiments below with same reference numerals.

(First Embodiment)

A first embodiment of the present disclosure will be described with reference to the drawings. A manufacturing method of a semiconductor substrate of the present embodiment is suitably applied to a manufacturing method of a semiconductor substrate with trenches used to form a PN column structure. Firstly, an etching device used in the manufacturing method of a semiconductor substrate of the present embodiment will be described.

As is shown in FIG. 1, an etching device 1 includes a reaction chamber 10. The reaction chamber 10 forms a vacuum chamber and has a gas introduction port 11 and a gas evacuation port 12. For more than one gaseous species to be introduced, the gas introduction port 11 connects to gas lines 11a through 11c in a matching number with gaseous species to be introduced. The gas lines 11a through 11c are provided with switching valves 13a through 13c, respectively. By controlling the respective switching valves 13a through 13c, not only a desired gaseous species can be introduced into the reaction chamber 10, but also a flow rate into the reaction chamber 10 can be controlled.

In the present embodiment, the gas introduction port 11 is provided with the three gas lines 11a through 11c to enable introducing of three types of gases: an $SF_6$ gas to perform an etching step, a $C_4F_8$ gas to perform a protection film forming step, and an $O_2$ gas to perform a protection film removing step.

The gas evacuation port 12 is provided with an evacuation valve 14. An internal pressure of the reaction chamber 10 can be set to a desired value by the evacuation valve 14 and the switching valves 13a through 13c provided to the gas lines 11a through 11c, respectively.

Also, the reaction chamber 10 has a built-in RF coil 15. The RF coil 15 generates an RF field inside the reaction chamber 10 upon supply of power from a plasma-generation power supply 16.

Further, the reaction chamber 10 is provided with an installation table 17 on which to place an Si wafer 20 to be etched. The installation table 17 is connected to a bias power supply 18, so that a predetermined bias can be applied to the Si wafer 20. Although it is not particularly shown, the installation table 17 has a mechanism by which a cooling He gas is introduced therein so as to cool the Si wafer 20 from a back surface side.

The above has described the configuration of the etching device 1 of the present embodiment. A manufacturing method of a semiconductor substrate using the etching device 1 will now be described with reference to FIG. 2.

In the present embodiment, although it will be described specifically below, when trenches are formed in the Si wafer 20, the trenches are dug down to a desired depth by repetitively performing the etching step, the protection film forming step, the protection film removing step, and an evacuation step.

Here, the etching step, the protection film forming step, and the protection film removing step are performed while an internal pressure of the reaction chamber 10 is controlled to take a desired value by appropriately opening and closing the switching valves 13a through 13c for a desired gaseous species to be introduced into the reaction chamber 10 from the gas introduction port 11, and by appropriately adjusting the evacuation valve 14 of the gas evacuation port 12 so as to evacuate the reaction chamber 10.

Also, the etching step, the protection film forming step, and the protection film removing step are performed by treating the Si wafer 20 with plasma, that is, by generating plasma from an introduced gaseous species with application of a high-frequency field to the plasma-generation power supply 16 and irradiating the plasma to the Si wafer 20 with application of a high-frequency field to the bias power supply 18.

Although treatment conditions are not particularly limited, the Si wafer 20 can be treated with plasma, for example, by turning an introduced gaseous species to plasma with a supply of power of about 1400 to 1500 W to the plasma-generation power supply 16 and by supplying power of about 0 W to 50 W to the bias power supply 18. Also, frequencies of the plasma-generation power supply 16 and the bias power supply 18 can be, for example, 300 kHz.

A specific manufacturing process will be described below. FIG. 2A through FIG. 2G show only a part of the Si wafer 20. It should be appreciated, however, that the same steps are performed across the entire Si wafer 20 in practice. In the present embodiment, a 6-inch wafer having a plurality of chip forming regions is used as the Si wafer 20, and the Si wafer 20 corresponds to a semiconductor wafer.

Figure 2A:
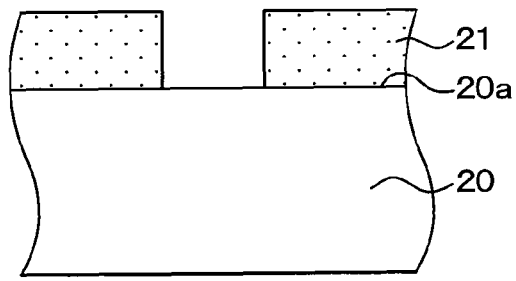
FIG. 2A is a cross-sectional view showing a part of a manufacturing process of the semiconductor substrate of the first embodiment.

Firstly, as is shown in FIG. 2A, the Si wafer 20 having a patterned, $SiO_2$ or resist mask member 21 formed on a surface 20a is prepared. This Si wafer 20 is placed on the installation table 17 in the reaction chamber 10.

Figure 2B:
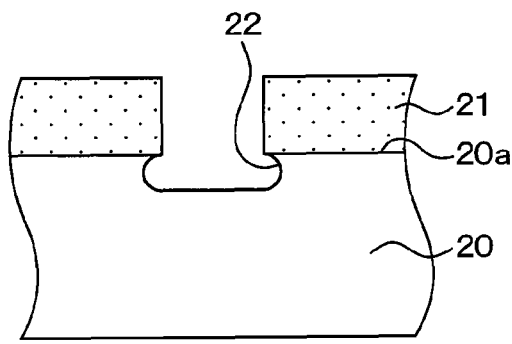
FIG. 2B is a cross-sectional view showing a part of the manufacturing process of the semiconductor substrate of the first embodiment.

Subsequently, the etching step of forming a trench 22 in the Si wafer 20 as shown in FIG. 2B is performed. At the etching step, about 200 to 300 sccm of an $SF_6$ gas is introduced into the reaction chamber 10 to raise an internal pressure of the reaction chamber 10 to 1 to 2 Pa. The trench 22 is then formed by turning the $SF_6$ gas into plasma and treating the Si wafer 20 with the $SF_6$ plasma for 1.0 to 1.5 seconds. A pressure at the etching step means an average pressure in a period since an internal pressure of the reaction chamber 10 rises to a predetermined pressure due to the $SF_6$ gas introduced therein till the treatment on the Si wafer 20 ends.

Figure 2C:
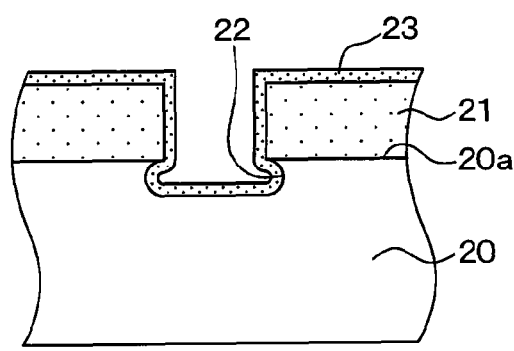
FIG. 2C is a cross-sectional view showing a part of the manufacturing process of the semiconductor substrate of the first embodiment.

Subsequently, the protection film forming step of forming a protection film 23 on a wall surface of the trench 22 as shown in FIG. 2C is performed. At the protection film forming step, 270 sccm of a $C_4F_8$ gas is introduced into the reaction chamber 10 to raise an internal pressure of the reaction chamber 10 to 1 to 2 Pa. The $C_4F_8$ gas is turned into plasma and the Si wafer 20 is treated with the $C_4F_8$ plasma for 0.5 to 1.0 second. Consequently, a fluorocarbon-based polymer film is formed on the wall surface of the trench 22. This polymer film is the protection film 23 of the present embodiment.

It should be noted at this step that by forming the protection film 23 with a supply of power of 0 W to the bias power supply, etching of the mask member 21 during formation of the protection film 23 can be suppressed. A pressure at the protection film forming step means an average pressure in a period since an internal pressure of the reaction chamber 10 rises to a predetermined pressure due to the $C_4F_8$ gas introduced therein until the treatment on the Si wafer 20 ends.

Figure 2D:
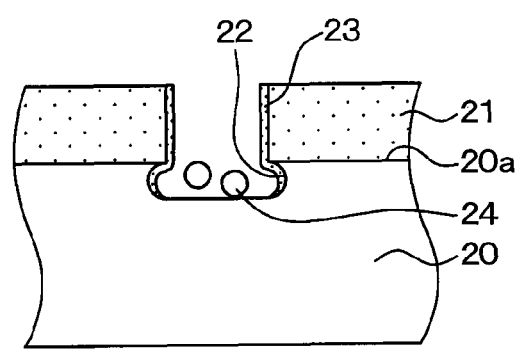
FIG. 2D is a cross-sectional view showing a part of the manufacturing process of the semiconductor substrate of the first embodiment.

Subsequently, the protection film removing step of removing the protection film 23 formed on a bottom surface of the trench 22 as shown in FIG. 2D is performed. At the protection film removing step, 100 to 150 sccm of an $O_2$ gas is introduced into the reaction chamber 10 to raise an internal pressure of the reaction chamber 10 to 1 to 2 Pa. The protection film 23 formed on the bottom surface of the trench 22 is removed by turning the $O_2$ gas into plasma and by treating the Si wafer 20 with the $O_2$ plasma for 0.5 to 1.0 second.

When this step is performed, a fluorine-based reaction gas 24 generated through a reaction of the $O_2$ plasma and the protection film 23 remains in the trench 22. The reaction gas 24 is schematically indicated by circles in FIG. 2D. A pressure at the protection film removing step means an average pressure in a period since an internal pressure of the reaction chamber 10 rises to a predetermined pressure due to the $O_2$ gas introduced therein till the treatment on the Si wafer 20 ends.

Figure 2E:
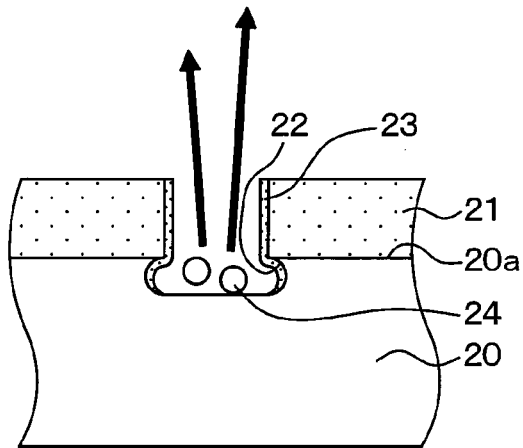
FIG. 2E is a cross-sectional view showing a part of the manufacturing process of the semiconductor substrate of the first embodiment.

Subsequently, the evacuation step of evacuating the reaction gas 24 generated at the protection film removing step as shown in FIG. 2E is performed. Although it will be described specifically below, the evacuation step is performed for 0.2 to 0.5 second by opening the evacuation valve 14 so that a pressure at the evacuation step drops to 0.65 Pa or below. Consequently, not only a gas (plasma) inside the reaction chamber 10 is evacuated, but also the reaction gas 24 remaining in the trench 22 is evacuated.

The pressure at the evacuation step means an average pressure in a period since an internal pressure of the reaction chamber 10 is decreased to a predetermined pressure by starting the evacuation step and until the evacuation ends.

Figure 2F:
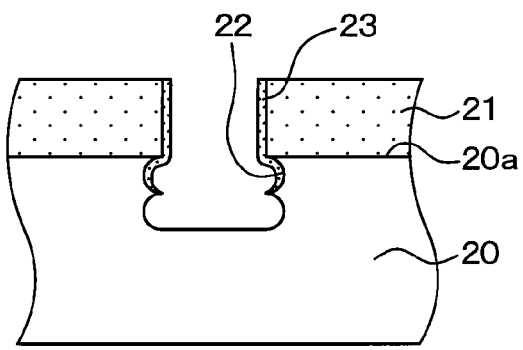
FIG. 2F is a cross-sectional view showing a part of the manufacturing process of the semiconductor substrate of the first embodiment.

Thereafter, the etching step of digging down the trench 22 as shown in FIG. 2F is performed. At this etching step, as with FIG. 2A, 200 to 300 sccm of the $SF_6$ gas is introduced into the reaction chamber 10 to raise an internal pressure of the reaction chamber 10 to 2 Pa. The trench 22 is then dug down by turning the $SF_6$ gas into plasma and treating the Si wafer 20 with the $SF_6$ plasma for 1.0 to 2.0 seconds.

At this point, the reaction gas 24 is already evacuated owing to the evacuation step of FIG. 2E. Hence, a variation in proportion of radicals in the $SF_6$ plasma reaching the bottom surface of each trench 22 formed in the respective chip forming regions within a plane of the Si wafer 20 can be suppressed. In other words, a variation in etching rate among the respective chip forming regions within a plane of the Si wafer 20 can be suppressed.

Figure 2G:
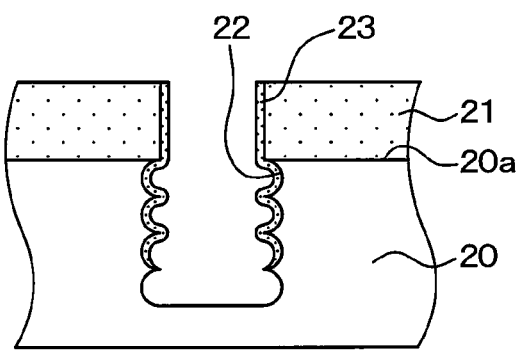
FIG. 2G is a cross-sectional view showing a part of the manufacturing process of the semiconductor substrate of the first embodiment.

Thereafter, the trench 22 is dug down to a desired depth as shown in FIG. 2G by repetitively performing the protection film forming step, the protection film removing step, the evacuation step, and the etching step described above.

The Si wafer 20 with the trenches 22 formed in the respective chip forming regions of the Si wafer 20 is thus formed. A semiconductor device using a semiconductor substrate having a PN column structure can be manufactured by dividing the Si wafer 20 into chips after an epitaxial film is grown on or a typical semiconductor manufacturing process is applied to the Si wafer 20.

In the present embodiment, the $SF_6$ introduced when the etching step is performed corresponds to a first introduced gas, the $C_4F_8$ gas introduced when the protection film forming step is performed corresponds to a second introduced gas, and the $O_2$ gas introduced when the protection film removing step is performed corresponds to a third introduced gas. The above has described the manufacturing method of a semiconductor substrate of the present embodiment.

According to the manufacturing method as above, the reaction gas 24 remaining in the trench 22 can be removed because the evacuation step is performed following the protection film removing step. Hence, when the trench 22 is dug down at the etching step, a variation in etching rate among the respective chip forming regions within a plane of the Si wafer 20 can be suppressed. In other words, a variation in depth of the trenches 22 formed in the respective chip forming regions within a plane of the Si wafer 20 can be suppressed.

Figure 3A:
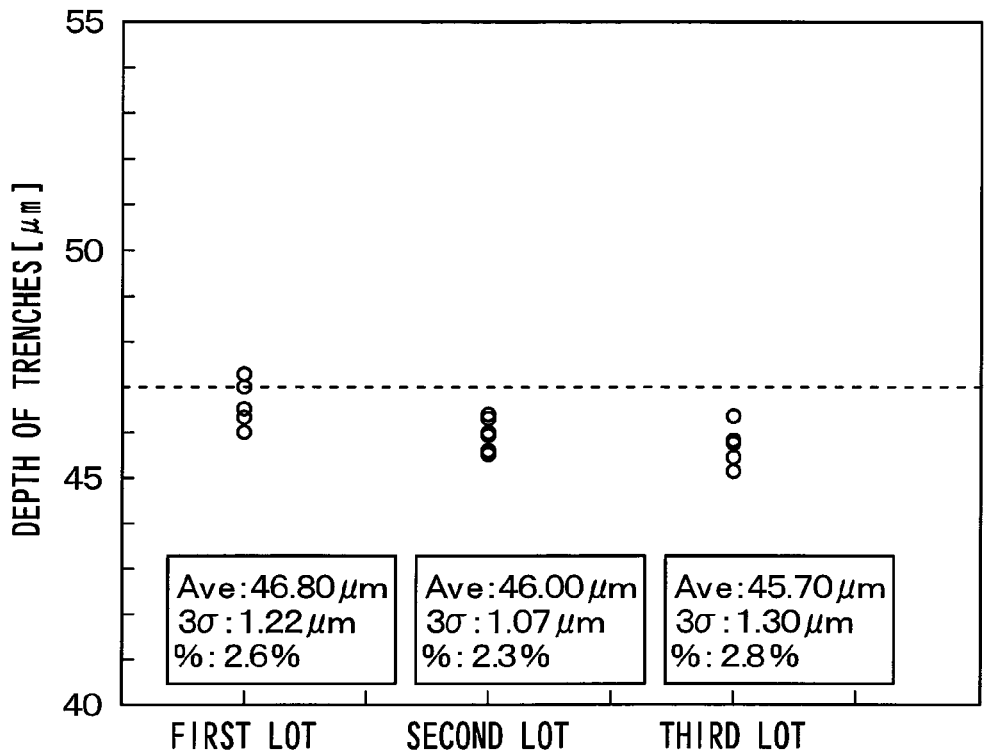
FIG. 3A is a view showing a variation in depth of trenches when trenches are formed without performing an evacuation step.
Figure 3B:
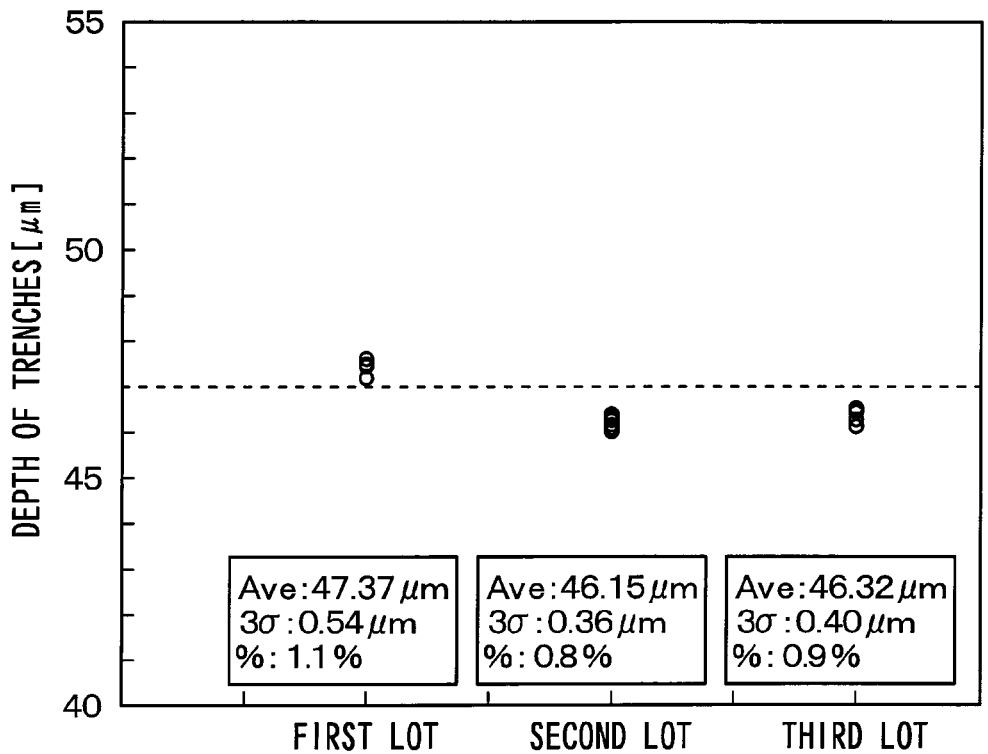
FIG. 3B is a view showing a variation in depth of trenches when trenches are formed by the manufacturing method of a semiconductor substrate of the first embodiment.

More specifically, as are shown in FIG. 3A and FIG. 3B, $3\sigma$ can be reduced and a variation in depth of the trenches 22 can be reduced to 0.9 to 1.1% by performing the evacuation step. A variation in depth of the trenches 22 means a value computed as: $\{3\sigma/\text{Ave(average)}\} \times 100$, and is expressed as % in FIG. 3A and FIG. 3B.

Figure 4:
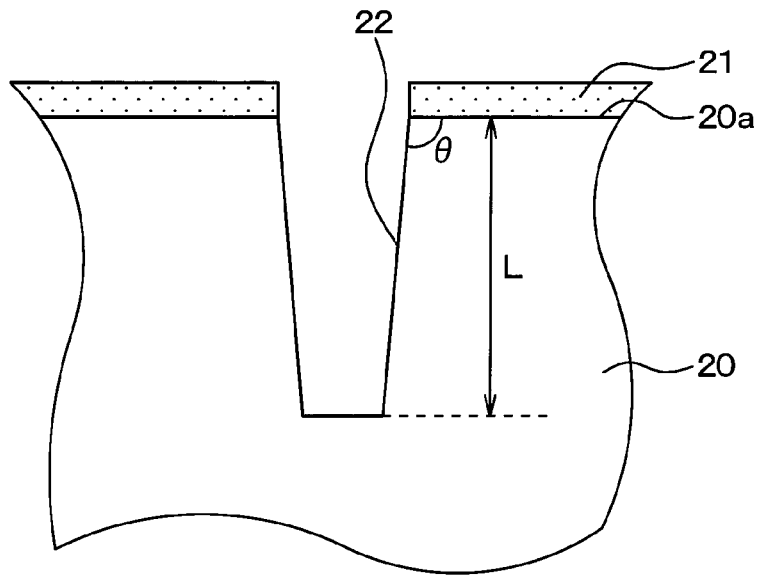
FIG. 4 is a view schematically showing a trench formed in an Si wafer.

FIG. 3A and FIG. 3B show results when the trenches 22 are formed to have a depth of 45 to 50 μm. The depth of the trenches 22 means a length L from the surface 20a of the Si wafer 20 to the bottom surface of the trench 22 as shown in FIG. 4.

Figure 5:
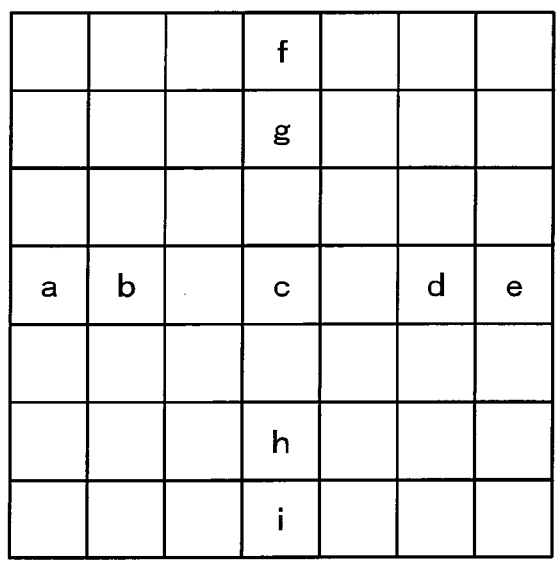
FIG. 5 is a planar schematic view showing chip forming regions of an Si wafer.

Also, FIG. 3A and FIG. 3B show results when evaluation subjects are the trenches 22 formed in nine chip forming regions a through i among the respective chip forming regions of the Si wafer 20 as shown in FIG. 5. Here, the respective chip forming regions a through i are of a square shape with a side length of 3 to 5 mm and 600 to 800 trenches 22 extending in a predetermined direction are provided in each region. Also, the Si wafer 20 is treated after it is placed in such a manner that the chip forming region c falls on the center of the installation table 17.

Further, the term, "lot", in FIG. 3A and FIG. 3B means 25 Si wafers 20 and the term, "Ave", means a depth average of the trenches 22 formed in 25 Si wafers 20.

In addition, because an internal pressure of the reaction chamber 10 at the evacuation step is controlled to be 0.65 Pa or below in the present embodiment, an advantageous effect of the evacuation step can be obtained satisfactorily.

Figure 6:
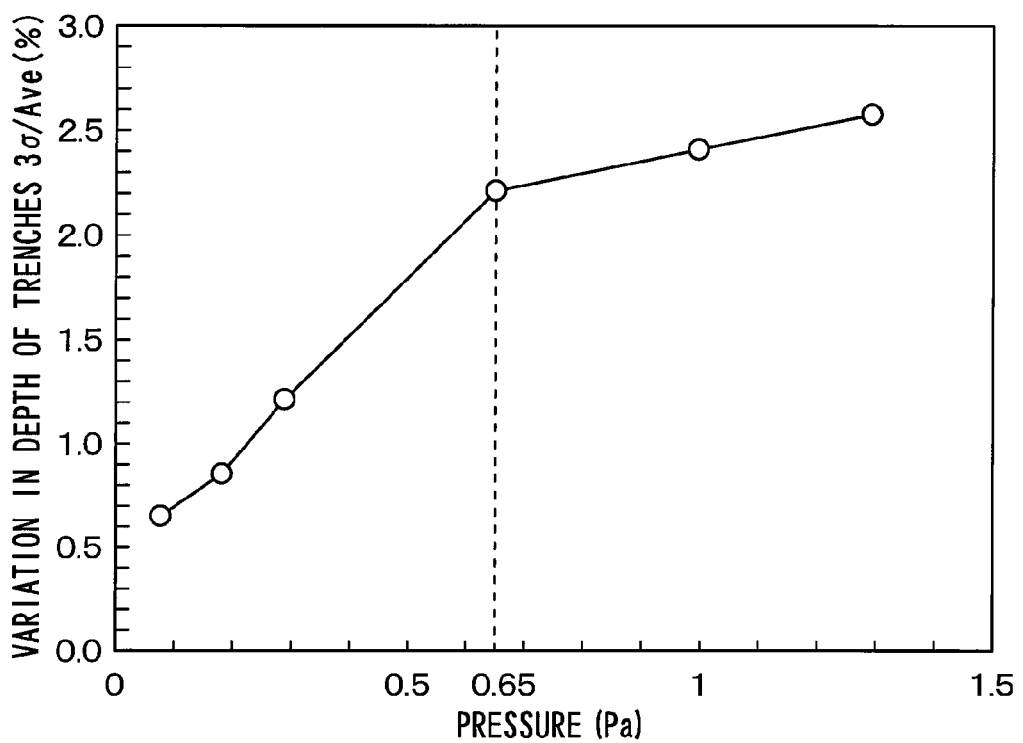
FIG. 6 is a view showing a relation of an internal pressure of a reaction chamber and a variation in depth of trenches.

In other words, as is shown in FIG. 6, when an internal pressure of the reaction chamber 10 at the evacuation step is higher than 0.65 Pa, the reaction gas 24 cannot be removed sufficiently and a variation in depth of the trenches 22 cannot be reduced sufficiently. In contrast, when an internal pressure of the reaction chamber 10 at the evacuation step is 0.65 Pa or below, a variation in depth of the trenches 22 steeply becomes smaller. Accordingly, the present embodiment is configured in such a manner that an internal pressure of the reaction chamber 10 at the evacuation step is controlled to be 0.65 Pa or below in order to obtain an advantageous effect of the evacuation step satisfactorily. FIG. 6 shows a result when the trenches 22 are formed to have a depth of 45 to 50 μm.

Figure 7:
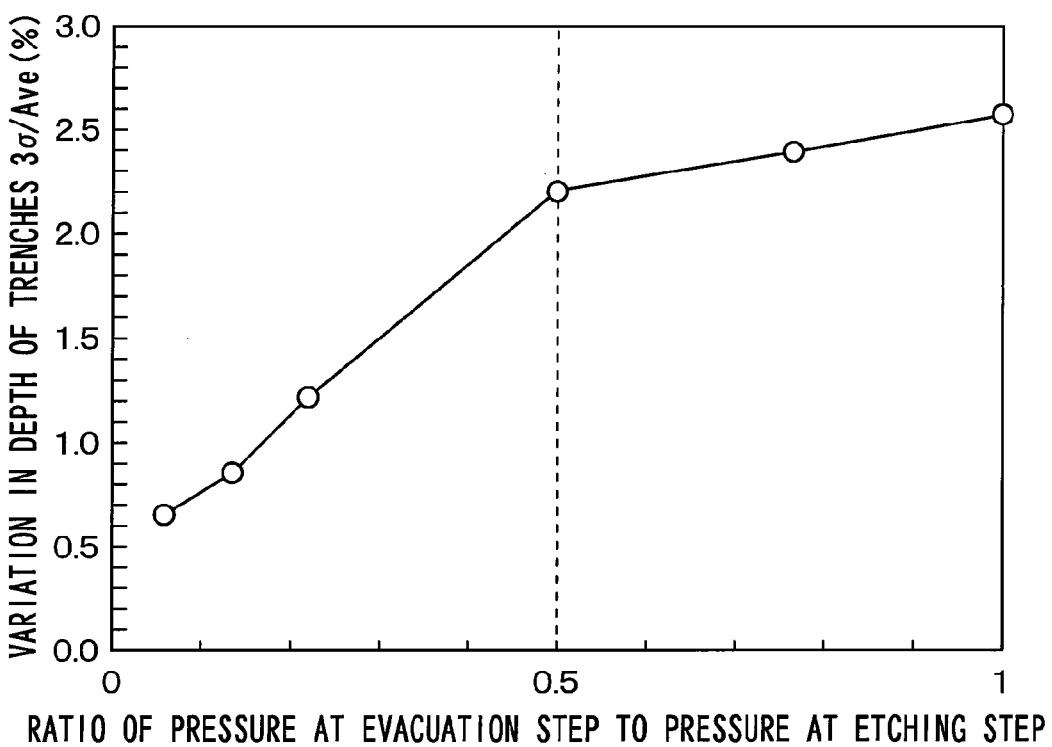
FIG. 7 is a view showing a relation of a ratio of an internal pressure of the reaction chamber at an evacuation step with respect to an internal pressure of the reaction chamber at an etching step and a variation in depth of trenches.

A ratio of an internal pressure of the reaction chamber 10 at the evacuation step with respect to an internal pressure of the reaction chamber 10 at the etching step can be derived from FIG. 6. In this case, as is shown in FIG. 7, the advantageous effect of the evacuation step can be obtained satisfactorily by controlling a ratio of an internal pressure of the reaction chamber 10 at the evacuation step with respect to an internal pressure of the reaction chamber 10 at the etching step to be 0.5 or below.

Figure 8:
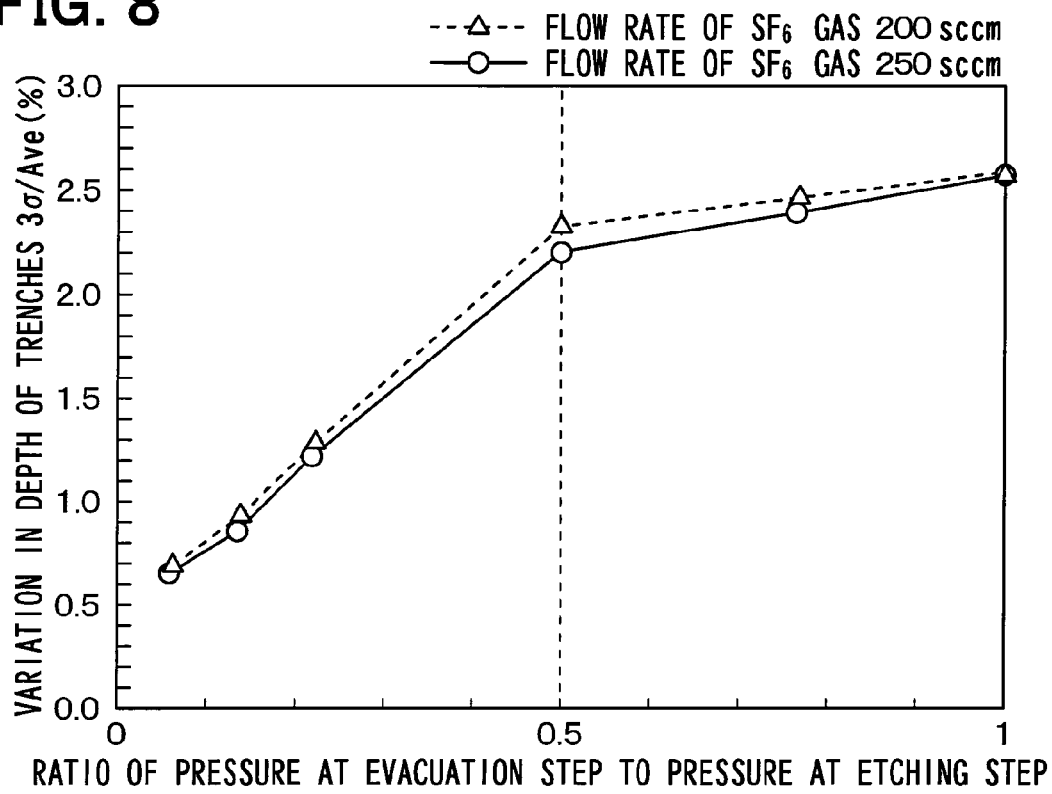
FIG. 8 is a view showing a relation of a ratio of an internal pressure of the reaction chamber at the evacuation step with respect to an internal pressure of the reaction chamber at the etching step and a variation in depth of trenches.

As is shown in FIG. 8, a ratio of an internal pressure of the reaction chamber 10 at the evacuation step with respect to an internal pressure of the reaction chamber 10 at the etching step does not depend on a introducing amount of the $SF_6$ gas when the etching step is performed. Here, an internal pressure of the reaction chamber 10 at the evacuation step with respect to an internal pressure of the reaction chamber 10 at the etching step means (internal pressure of the reaction chamber 10 at the evacuation step)/(internal pressure of the reaction chamber 10 at the etching step).

In the evacuation step, the reaction gas 24 remaining in the trench 22 can be removed more by decreasing an internal pressure of the reaction chamber 10 further. It should be noted, however, that the trench 22 is formed in an inversely tapered shape when the pressure becomes too low.

In other words, a reaction gas of the $SF_6$ and the protection film 23 is generated also at the etching step and this reaction gas remains in the trench 22. In addition, as is when the etching step is performed, a flow velocity of the $C_4F_8$ plasma is different between a center and an outer edge of the Si wafer 20 when the protection film forming step is performed. A flow velocity of the $C_4F_8$ plasma irradiated to the center of the Si wafer 20 is higher than a flow velocity of the $C_4F_8$ plasma irradiated to the outer edge.

Hence, when the reaction gas remains in the trench 22, a proportion of radicals in the $C_4F_8$ plasma reaching the bottom portion of a trench 22 formed in the center of the Si wafer 20 and a proportion of radials in the $C_4F_8$ plasma reaching the bottom portion of a trench 22 formed in the outer edge of the Si wafer 20 are different. Accordingly, the protection films 23 in the respective chip forming regions within a plane of the Si wafer 20 vary in thickness. In particular, the protection films 23 formed in the chip forming regions located in the outer edge of the Si wafer 20 become thinner.

Hence, when the protection film removing step is performed, not only the protection film 23 formed on the bottom surface of the trench 22 but also the protection film 23 formed on the side wall is removed particularly in the chip forming regions located in the outer edge of the Si wafer 20.

When the etching step is performed in this state, the $SF_6$ plasma readily reaches the bottom surface and the side wall on the bottom surface side of the trench 22 when an internal pressure of the reaction chamber 10 at the evacuation step is decreased excessively. Hence, a part (side wall on the bottom surface side) of the trench 22 is also etched and the trench 22 of an inversely tapered shape is formed.

When an epitaxial film is embedded in this trench 22, a hollow may possibly be formed in the trench 22. When a semiconductor device is manufactured using such a semiconductor substrate, a breakdown voltage is decreased by the hollow.

Figure 9:
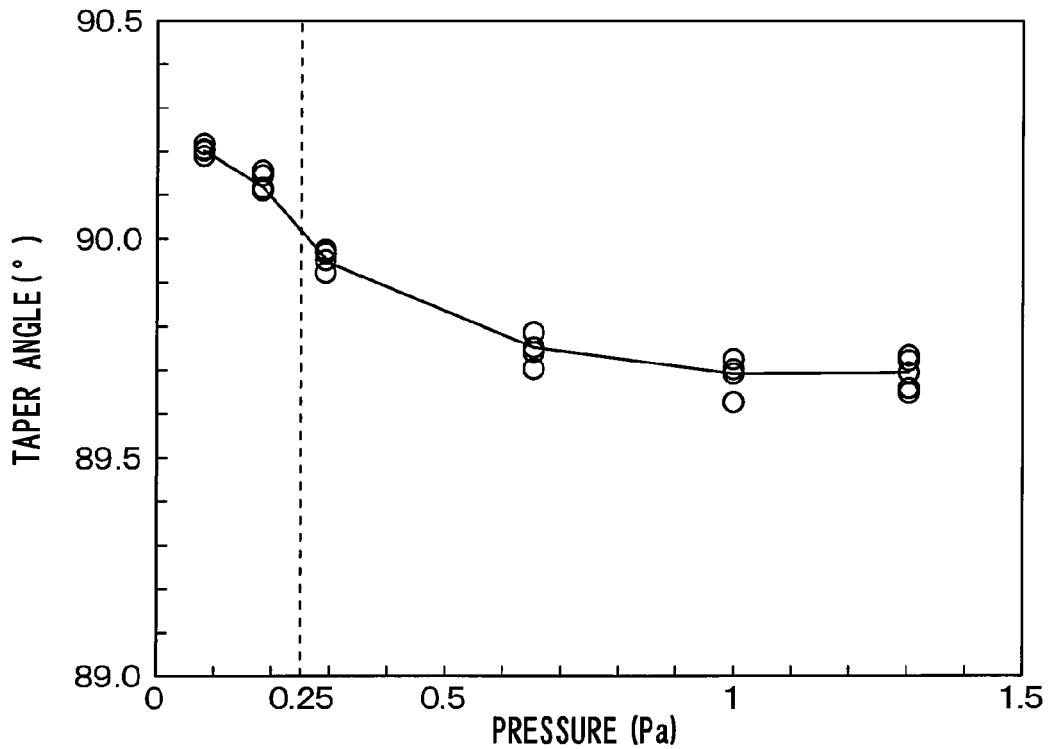
FIG. 9 is a view showing a relation of an internal pressure of the reaction chamber and a taper angle.

It is therefore preferable to control an internal pressure of the reaction chamber 10 at the evacuation step to be 0.25 Pa or higher as is shown in FIG. 9. In other words, it is preferable to control a pressure when the evacuation step is performed to be in a range from 0.25 Pa to 0.65 Pa, both inclusive. Owing to this configuration, formation of the trenches 22 of an inversely tapered shape can be suppressed while suppressing a variation in depth of the trenches 22 within a plane of the Si wafer 20.

FIG. 9 shows a result when the trenches 22 are formed to have a depth of 45 to 50 μm and an evaluation is made on the trenches 22 formed in the chip forming region c of FIG. 5 by introducing about 200 to 300 sccm of the $SF_6$ gas when the etching step is performed. Also, as is shown in FIG. 4, a taper angle means an angle θ formed between the surface 20a of the Si wafer 20 and the side wall of the trench 22.

Figure 10:
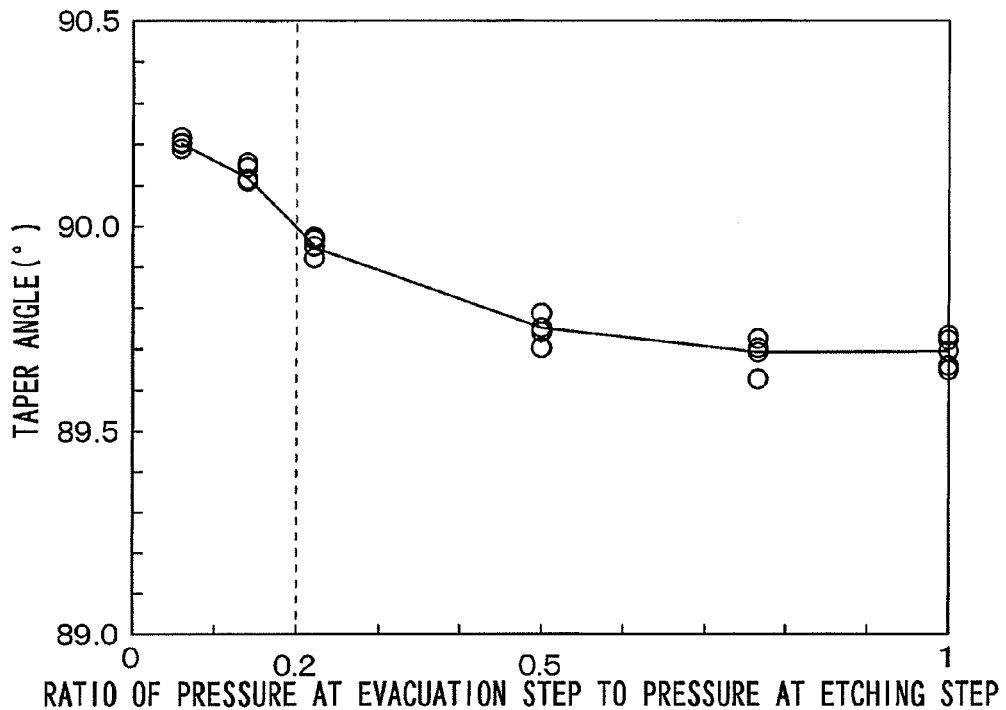
FIG. 10 is a view showing a relation of a ratio of an internal pressure of the reaction chamber at the evacuation step with respect to an internal pressure of the reaction chamber at the etching step and a taper angle.

In addition, a ratio of an internal pressure of the reaction chamber 10 at the evacuation step with respect to an internal pressure of the reaction chamber 10 at the etching step can be derived from FIG. 9. In this case, as is shown in FIG. 10, formation of the trench 22 of an inversely tapered shape can be suppressed by controlling a ratio of an internal pressure of the reaction chamber 10 at the evacuation step with respect to an internal pressure of the reaction chamber 10 at the etching step to be 0.2 or below.

(OTHER EMBODIMENTS)

In the first embodiment above, an $O_2$ gas is introduced into the reaction chamber 10 at the protection film removing step. It should be appreciated, however, that an $SF_6$ gas may be introduced instead at the protection film removing step. In short, an $SF_6$ gas can be used as the first as well as third introduced gases.

The first embodiment above has described the manufacturing method by which the trenches 22 are dug down by repetitively performing the etching step, the protection film forming step, the protection film removing step, and the evacuation step. It should be appreciated, however, that the evacuation step may not be performed each time the steps are repetitively performed. In other words, in a case where an aspect ratio expressed as (trench depth)/(width of opening) is low, the reaction gas 24 hardly remains in the trenches 22 and the reaction gas 24 naturally goes out of the trenches 22. Hence, the evacuation step may be performed before the etching step of forming the trenches 22 with a high aspect ratio.

Figure 11:
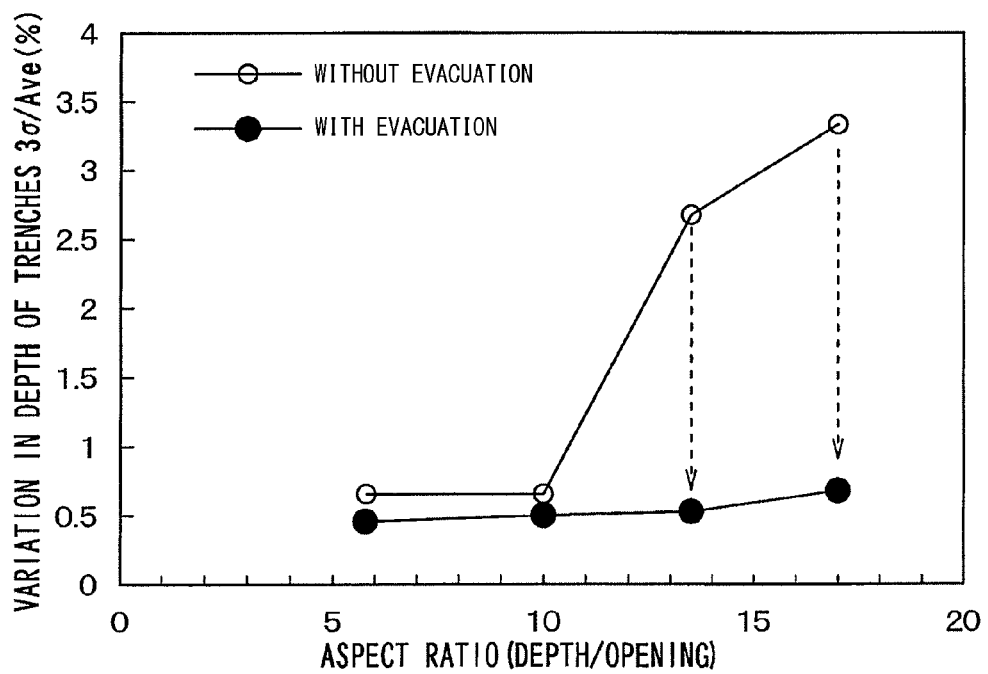
FIG. 11 is a view showing a relation of an aspect ratio and a variation in depth of trenches.

More specifically, as is shown in FIG. 11, when the trenches 22 are formed without performing the evacuation step, a variation in depth of the trenches 22 abruptly becomes larger in a case where the trenches 22 with an aspect ratio of 10 or higher are formed. Hence, the evacuation step may be performed before the etching step of forming the trenches 22 with an aspect ratio of 10 or higher.

In other words, in a case where the trenches 22 with an aspect ratio of 10 or lower are formed even though the etching step is performed, the trenches 22 are dug down by repetitively performing the etching step, the protection film forming step, and the protection film removing step. The evacuation step is added before the etching step of forming the trenches 22 with an aspect ratio of 10 or higher, so that the trenches 22 are dug down by repetitively performing the etching step, the protection film forming step, the protection film removing step, and the evacuation step.

In FIG. 11, a result in the case of with evacuation is the result when the evacuation step is performed by controlling an internal pressure of the reaction chamber 10 to be 0.3 Pa.

Further, the trenches 22 with a desired depth may be formed by performing the evacuation step after the etching step, the protection film forming step, and the pretension removing step are repetitively performed several times, followed by performing again the etching step, the protection film forming step, and the protection film removing step. In other words, by performing the evacuation step at least once, a variation in depth of the trenches 22 can be suppressed in comparison with the conventional manufacturing method of a semiconductor substrate.

Furthermore, the first embodiment above has described that it is preferable to control an internal pressure of the reaction chamber 10 at the evacuation step to be 0.25 Pa or higher in order to suppress the formation of the trenches 22 in an inversely tapered shape. However, it may be configured as follows. That is, the evacuation step may also be performed following the etching step. When configured in this manner, a reaction gas generated at the etching step can be evacuated. Hence, the $C_4F_8$ plasma more readily reaches the bottom portion of the trench 22 at the protection film forming step, and formation of the thinner protection film 23 at the bottom of the trench 22 can be suppressed. Accordingly, the formation of the trench 22 of an inversely tapered shape when the trench 22 is dug down at the etching step can be suppressed.

The invention claimed is:

1. A manufacturing method of a semiconductor substrate, comprising steps of:
   (a) introducing a semiconductor wafer with a mask member patterned in a predetermined pattern and formed on a surface of the semiconductor wafer into a reaction chamber;
   (b) etching a trench in the semiconductor wafer according to the pattern of the mask member through treatment on the semiconductor wafer by introducing a first gas into the reaction chamber and converting the first gas into a first plasma within the reaction chamber;
   c) forming a protection film on a wall surface and a bottom surface of the trench etched into the semiconductor wafer by introducing a second gas into the reaction chamber and converting the second gas into a second plasma within the reaction chamber;
   (d) removing the protection film formed on the bottom surface of the trench etched into the semiconductor wafer by introducing a third gas into the reaction chamber and converting the third gas into a third plasma;
   (e) repeating a cycle of steps (b), (c) and (d) until an aspect ratio of a depth of the trench to a width of the trench becomes at least 10, the aspect ratio of the trench being expressed as a ratio of a depth of the trench with respect to a width of an opening of the trench; and
   (f) evacuating the reaction chamber after the aspect ratio becomes larger than the at least 10,
   wherein step (f) is performed after the step (d) in at least one of the cycles of steps (b), (c) and (d).

2. The manufacturing method of a semiconductor substrate according to claim 1, wherein
   an amount of the trench depth is increased for each cycle of steps by the reaction chamber after each removing step.

3. The manufacturing method of a semiconductor substrate according to claim 1, wherein
   the reaction chamber is evacuated to an internal pressure of 0.65 Pa or below.

4. The manufacturing method of a semiconductor substrate according to claim 1, wherein
   a ratio of an internal pressure of the reaction chamber when the reaction chamber is evacuated with respect to an internal pressure of the reaction chamber when the trench is etched is 0.5 or below.

5. The manufacturing method of a semiconductor substrate according to claim 1, wherein
   the reaction chamber is evacuated further after each of the etching steps and before each of the protecting steps.

* * * * *